US009558976B2

United States Patent
Kawasaki et al.

(10) Patent No.: US 9,558,976 B2
(45) Date of Patent: Jan. 31, 2017

(54) SUBSTRATE PROCESSING APPARATUS, METHOD OF TRANSFERRING SUBSTRATE, METHOD OF MANUFACTURING SEMICONDUCTOR DEVICE, AND STATE DETECTING PROGRAM

(71) Applicant: Hitachi Kokusai Electric Inc., Tokyo (JP)

(72) Inventors: Junichi Kawasaki, Toyama (JP); Hajime Abiko, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 560 days.

(21) Appl. No.: 13/788,896

(22) Filed: Mar. 7, 2013

(65) Prior Publication Data
US 2013/0238113 A1 Sep. 12, 2013

(30) Foreign Application Priority Data

Mar. 8, 2012 (JP) .................................. 2012-052046
Jan. 29, 2013 (JP) .................................. 2013-014548

(51) Int. Cl.
*H01L 21/677* (2006.01)
*H01L 21/02* (2006.01)
*H01L 21/67* (2006.01)

(52) U.S. Cl.
CPC ....... *H01L 21/677* (2013.01); *H01L 21/02002* (2013.01); *H01L 21/67265* (2013.01); *H01L 21/67288* (2013.01)

(58) Field of Classification Search
None
See application file for complete search history.

(56) References Cited

U.S. PATENT DOCUMENTS

| 5,334,257 | A | * | 8/1994 | Nishi | H01L 21/67781 118/500 |
| 5,409,348 | A | * | 4/1995 | Suzuki | 414/811 |
| 7,975,376 | B2 | | 7/2011 | Hirano et al. | |
| 2007/0148607 | A1 | * | 6/2007 | Tani | F27B 5/04 432/241 |
| 2008/0193274 | A1 | * | 8/2008 | Hirano et al. | 414/804 |
| 2010/0057249 | A1 | * | 3/2010 | Abe et al. | 700/230 |

FOREIGN PATENT DOCUMENTS

| JP | 2005142244 | | 6/2005 |
| WO | 2005031851 | A1 | 4/2005 |

* cited by examiner

Primary Examiner — Sean Shechtman
(74) Attorney, Agent, or Firm — Edell, Shapiro & Finnan LLC

(57) ABSTRACT

A substrate processing apparatus includes a substrate retaining mechanism into which retaining members on which substrates are placed are installed to retain the substrates; a substrate transfer unit configured to transfer at least one substrate; a detecting unit configured to detect states of the retaining members installed into the substrate retaining mechanism; a determination unit configured to compare data representing the states of the retaining members, which is obtained by the detecting unit, with master data, which is reference data obtained by detecting normal states of the retaining members, beforehand to determine the states of the retaining members; and a transfer control unit configured to control the substrate transfer unit according to the determination of the determination unit.

14 Claims, 15 Drawing Sheets

THICKNESS REFERENCE VALUE PATTERN
ACCORDING TO TYPE OF WAFER

| PRODUCT WAFER | 0.5000 |
|---|---|
| SIDE DUMMY | 0.8000 |
| MONITOR 1 | 0.3000 |
| FILL DUMMY | 0.8000 |
| MONITOR 2 | 0.4000 |

SUBSTRATE PROCESSING APPARATUS, METHOD OF TRANSFERRING SUBSTRATE, METHOD OF MANUFACTURING SEMICONDUCTOR DEVICE, AND STATE DETECTING PROGRAM

CROSS REFERENCE TO RELATED APPLICATIONS

This application claims foreign priority under 35 U.S.C. §119(a)-(d) to Application No. JP 2012-052046 filed on Mar. 8, 2012 and Application No. JP 2013-014548 filed on Jan. 29, 2013, the entire contents of each of which are hereby incorporated by reference.

FIELD OF THE INVENTION

The present invention relates to a substrate processing apparatus which is capable of performing various treatments, e.g., thin film formation, oxidization, impurity diffusion, annealing, etching, etc., on a substrate (e.g., a silicon wafer, a glass substrate, etc.), and particularly, detecting deformation of or a crack in the substrate and a retaining member configured to position the substrate; a method of transferring a substrate; a method of manufacturing a semiconductor device, and a state detecting program.

BACKGROUND

As a type of a substrate processing apparatus, a batch type substrate processing apparatus includes a vertical-type reaction furnace, a boat that is a substrate retaining mechanism configured to retain a predetermined number of substrates to be processed (hereinafter referred to as 'wafers') such that the wafers are retained in a horizontal posture and a multi-stage manner, and a substrate transfer machine configured to transfer the wafers into the boat, and processes the wafers in the reaction furnace while the wafers are retained in the boat.

Conventionally, a wafer crack detecting mechanism is installed in a substrate processing apparatus to detect a defect occurring in a wafer, so that substrate processing may be prevented from being continuously performed when a defect (e.g., bending, a crack, or misalignment) occurs in the wafer due to a thermal stress caused by a temperature rise in the reaction furnace or a cooling process when the wafer is unloaded from the reaction furnace.

The wafer crack detecting mechanism includes a photo sensor, and detects the presence or absence of a wafer, a wafer crack, or wafer dropping in each of slots based on a waveform indicating an increase/decrease in the amount of light obtained by vertically adjusting an optical axis with respect to which the photo sensor radiates light in a horizontal direction in a manner that the radiated light is directed to a position of the wafer retained in the boat located about 5 mm to 10 mm toward a center of the wafer from a circumference of the wafer.

When a wafer is retained normally, the amount of light decreases starting from a lower part of the wafer and returns to its original level at an upper part of the wafer, and the state of the wafer is determined according to whether the amount of light falls within a reference level. When a matter other than the wafer is present in a region in which the optical axis and the wafer overlap, the matter is reflected in the waveform of the amount of light and it is thus determined that the wafer is in an abnormal state.

A substrate processing apparatus may be manufactured such that a ring-type retaining member is mounted on a boat and a wafer is placed on the retaining member so as to improve process performance conditions. However, if the retaining member is mounted on the boat, the retaining member may be present on an optical axis of the wafer crack detecting mechanism and a waveform of the amount of light may thus be influenced by the retaining member. Thus, the wafer crack detecting mechanism cannot be used in this case.

Furthermore, in this case, substrate processing is performed in a state in which the retaining member is mounted on the boat. In this case, deformation or misalignment of the retaining member may occur due to heat. Accordingly, there is a need to develop a mechanism capable of detecting whether deformation or misalignment occurs in the retaining member beforehand.

SUMMARY

To solve this problem, it is an object of the present invention to provide a substrate processing apparatus capable of detecting a defect occurring in a retaining member or a substrate beforehand even when the substrate is retained on a substrate retaining mechanism in which the retaining member is installed, a method of transferring a substrate, a method of manufacturing a semiconductor device, and a state detecting program.

According to one aspect of the present invention, there is provided a substrate processing apparatus including: a substrate retaining mechanism having a retaining member for placing a substrate thereon; a substrate transfer unit configured to transfer the substrate; a detecting unit configured to detect a state of the retaining member; a determination unit configured to compare a data obtained by the detecting unit with a master data obtained by the detecting unit to determine the state of the retaining member, the data representing the state of the retaining member, and the master data representing a normal state of the retaining member; and a transfer control unit configured to control the substrate transfer unit based on a determination result of the determination unit.

According to another aspect of the present invention, there is provided a substrate transfer method performed in a substrate processing apparatus including at least a substrate retaining mechanism having a retaining member for placing a substrate thereon; a substrate transfer unit configured to transfer the substrate; and a transfer control unit configured to control the substrate transfer unit, the method including: (a) determining a state of the retaining member by comparing a data representing the state of the retaining member with a master data representing a normal state of the retaining member; and (b) transferring the substrate into the substrate retaining mechanism based on a determination result obtained in (a).

According to still another aspect of the present invention, there is provided a method of manufacturing a semiconductor device using a substrate processing apparatus including at least a substrate retaining mechanism having a retaining member for placing a substrate thereon; a substrate transfer unit configured to transfer the substrate; and a transfer control unit configured to control the substrate transfer unit, the method including: (a) determining a state of the retaining member by comparing a data representing the state of the retaining member with a master data representing a normal state of the retaining member; and (b) transferring the substrate into the substrate retaining mechanism according to a determination result obtained in (a); and (c) loading the substrate retaining mechanism into a process chamber included in the substrate processing apparatus and processing the substrate.

According to yet another aspect of the present invention, there is provided a non-transitory recording medium storing a retaining member state detection program executed by a substrate processing apparatus including at least a substrate retaining mechanism into which a retaining member on which a substrate is placed is installed, a substrate transfer unit configured to transfer the substrate, and a transfer control unit configured to control the substrate transfer unit, the retaining member state detection program including: a first step of controlling a detection unit configured to detect a state of the retaining member, to obtain waveform data; a second step of controlling a determination unit to obtain data representing upper and lower ends of the retaining member, from the waveform data; a third step of controlling the determination unit to compare master data obtained by detecting a normal state of the retaining member with the waveform data to determine the state of the retaining member; and a fourth step of suspending substrate processing when an error is detected in the third step.

According to the present invention, when a substrate is placed on a retaining member mounted in a substrate retaining mechanism, both the state of the retaining member and the state of the substrate placed on the retaining member may be detected, thereby detecting both an error caused by the retaining member and an error caused by the substrate beforehand.

BRIEF DESCRIPTION OF THE DRAWINGS

FIGS. 6A and 6B are plane views illustrating state detection performed by a detecting unit included in a substrate transfer mechanism according to an embodiment of the present invention, in which FIG. 6A illustrates a state in which a substrate is not placed on a retaining member and FIG. 6B illustrates a state in which the substrate is placed on the retaining member.

DETAILED DESCRIPTION

Hereinafter, exemplary embodiments of the present invention will be described with reference to the accompanying drawings.

Figure 1:
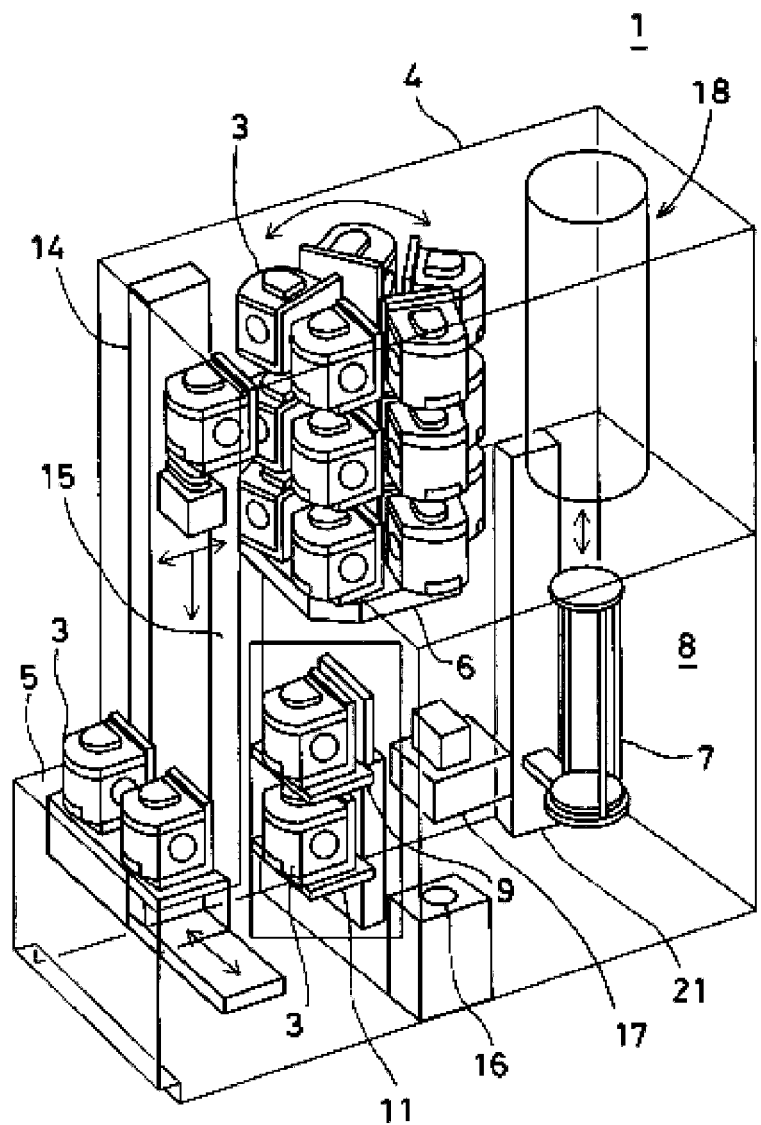
FIG. 1 is a perspective view of a substrate processing apparatus according to an embodiment of the present invention.
Figure 2:
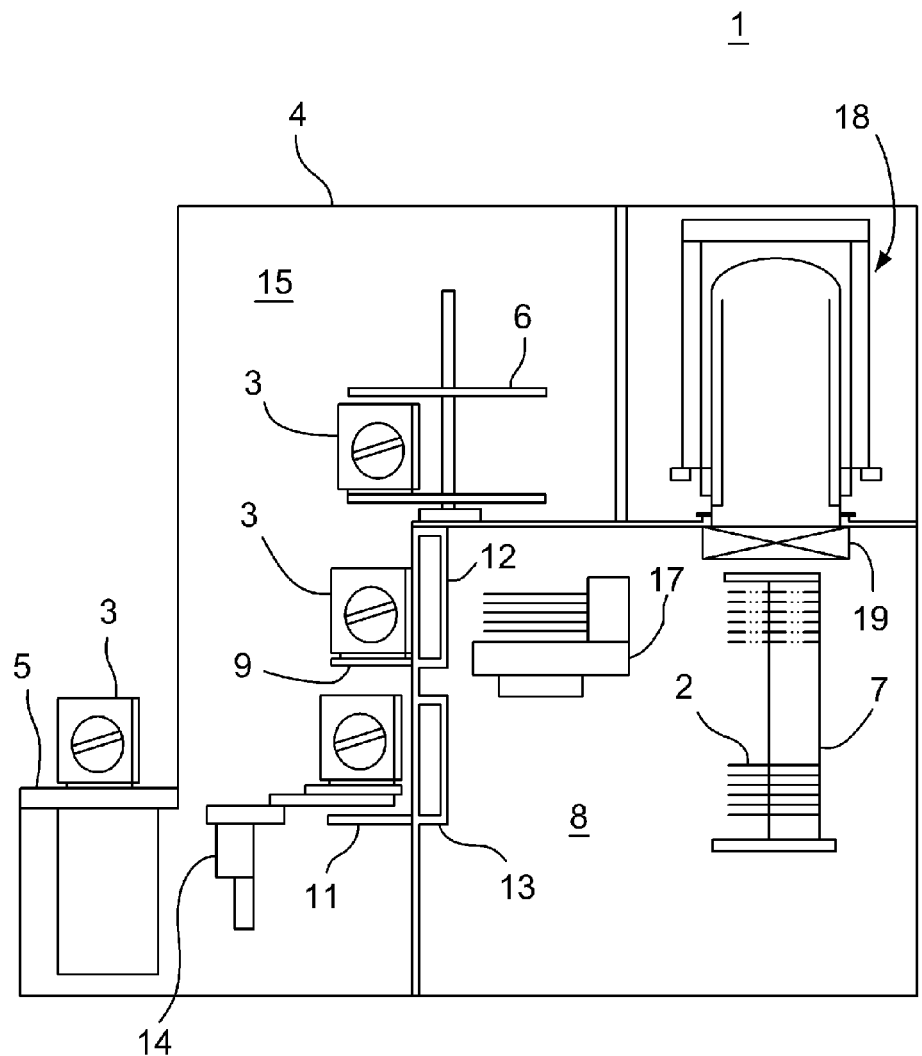
FIG. 2 is a cross-sectional view of a substrate processing apparatus according to an embodiment of the present invention.

First, a substrate processing apparatus 1 according to an embodiment of the present invention will be described with reference to FIGS. 1 and 2.

In the following description, a case in which a vertical-type substrate processing apparatus including a vertical-type furnace configured to perform a predetermined processing such as a diffusion treatment or chemical vapor deposition (CVD) on a substrate is applied as a substrate processing apparatus will be described.

In order to load closed substrate containers (front opening unified pod (FOUP)) (hereinafter referred to as 'cassettes' 3) in which substrates (e.g., wafers 2 formed of silicon and the like) are accommodated into a housing 4 from the outside and unload the cassettes 3 from the housing 4 to the outside, an input/output (I/O) stage 5 (substrate container exchanging unit) is installed at a front of the housing 4 and a cassette shelf 6 (storage means) is installed in the housing 4 to store the loaded cassettes 3.

Also, an airtight chamber 8 serving as a space which a boat 7 (substrate retaining mechanism) which will be described in detail below is loaded into or unloaded from, is installed as an area to which the wafers 2 are transferred.

When the wafers 2 are processed, the inside of the airtight chamber 8 is configured to be filled with an inert gas, such as $N_2$ gas, so as to prevent a natural oxide film from being formed on the wafers 2.

A FOUP, which has recently been used as a type of closed substrate container, is used as each of the cassettes 3. The wafers 2 may be transferred while being isolated from the air by blocking an opening formed in a first side surface of each of the cassettes 3 with a lid (not shown), and may be carried into or out of each of the cassettes 3 by removing the lid. In order to communicate the inside of the cassette 3 with the airtight chamber 8 by removing the lid of the cassette 3, a plurality of sets of cassette placing stages 9 and 11 (substrate container placing means) (two sets of cassette placing stages 9 and 11 in the case of the embodiment of FIG. 1) are installed at a front of the airtight chamber 8, and cassette openers 12 and 13 (closing/opening means) are installed on portions of the airtight chamber 8 facing the cassette placing stages 9 and 11, respectively. The cassette openers 12 and 13 may be individually driven, and the cassettes 3 placed on the cassette placing stages 9 and 11 may be individually closed/opened.

The cassettes 3 are transferred among the cassette placing stages 9 and 11, the cassette shelf 6, and the I/O stage 5 by a cassette transfer device 14 (carrier transfer unit). In a transfer space 15 to which the cassettes 3 are transferred by the cassette transfer device 14, clean air flows from a cleaning unit (not shown) installed in the housing 4.

In the airtight chamber 8, the boat 7 in which a plurality of wafers 2 are horizontally stacked in a multistage manner and a substrate location adjustment apparatus 16 configured to adjust a notch (or orientation flat) of the wafer 2 to a desired position are installed. Also, a set of wafer transfer machines 17 (substrate transfer units) configured to transfer the wafers 2 are installed among the cassettes 3 on the cassette placing stages 9 and 11, the substrate location adjustment apparatus 16, and the boat 7. Also, a process furnace 18 is installed on the airtight chamber 8 to process the wafers 2, and a furnace port which is a lower opening in the process furnace 18 is closed/opened by a furnace port gate valve 19. The furnace port gate valve 19 is configured such that the boat 7 is loaded into or unloaded from the process furnace 18 by a boat elevator 21 (elevating unit) while the furnace port gate valve 19 is open and the furnace port gate valve 19 is closed during transfer of the wafers 2 to the boat 7.

Figure 3:
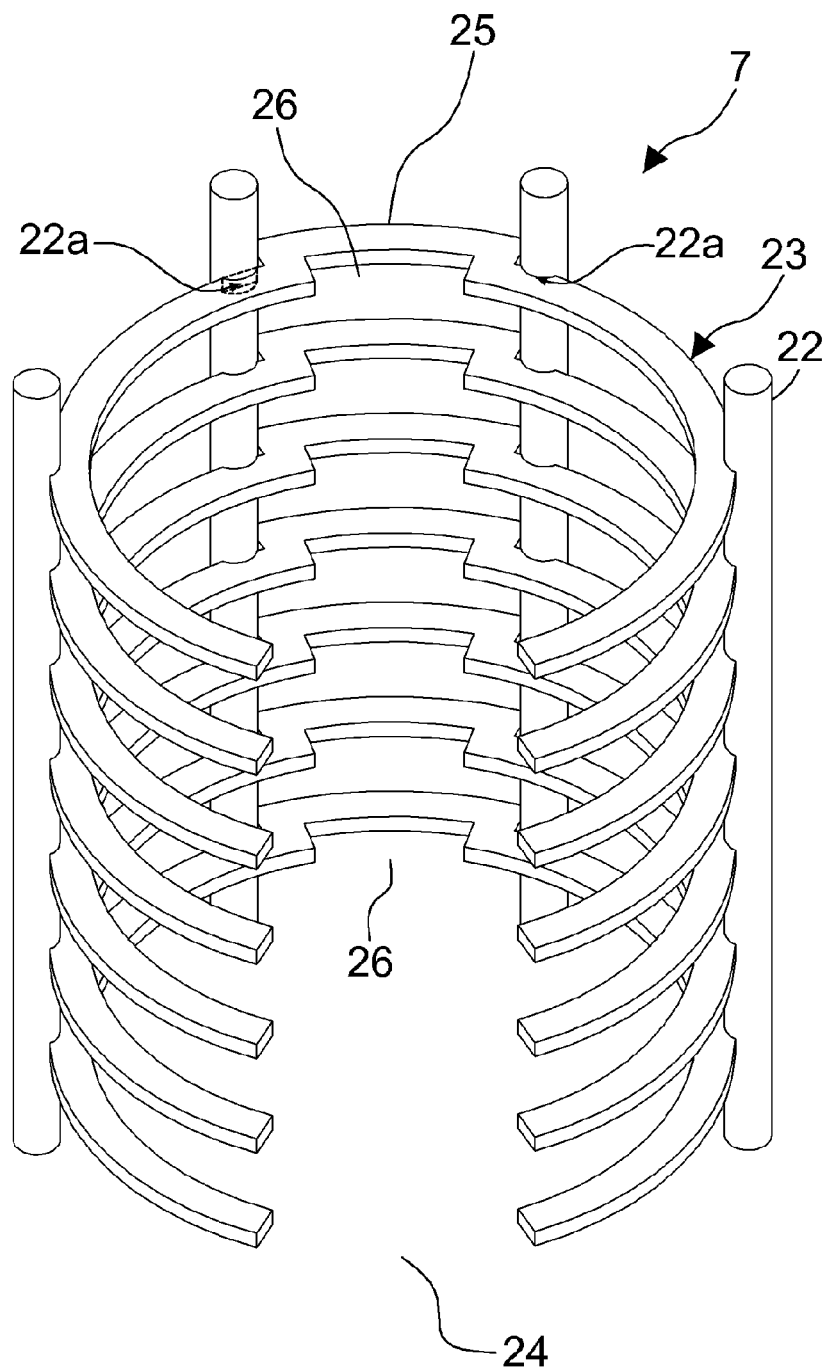
FIG. 3 is a perspective view of a substrate retaining mechanism loaded/unloaded in the substrate processing apparatus.

FIG. 3 illustrates the boat 7 according to the present embodiment.

In the present embodiment, the boat 7 is a ring boat, in which a disk type top plate (not shown) and a disk type bottom plate (not shown) are connected by four cylindrical pillars 22 formed of, for example, quartz, silicon carbide, etc. In the four pillars 22, installation grooves are engraved at predetermined intervals and slots 22a which are installation portions serving as a mounting unit are formed by the installation grooves. In the slots 22a, a plurality of plates 23 (hereinafter referred to as 'wafer retaining rings 23') which are retaining members having roughly ring shapes and configured to retain the wafers 2 are mounted. The plurality of wafer retaining rings 23 are mounted between the pillars 22 such that they are vertically stacked in a horizontal (or roughly horizontal) posture at predetermined intervals.

In each of the plurality of wafer retaining rings 23, a first notch portion 24 is formed by cutting away a portion of a ring of the side (lower side of the page in FIG. 3) into which the wafers 2 are inserted, a protruding portion 25 protrudes in an outer circumferential direction from a location facing the first notch portion 24, and a second notch portion 26 is formed by cutting away an inner circumference of the protruding portion 25.

Due to the first notch portion 24 and the second notch portion 26, wafer supporters (tweezers) of the wafer transfer machine 17 do not contact the wafer retaining rings 23 when the wafer 2 is placed on each of the wafer retaining rings 23.

Figure 4:
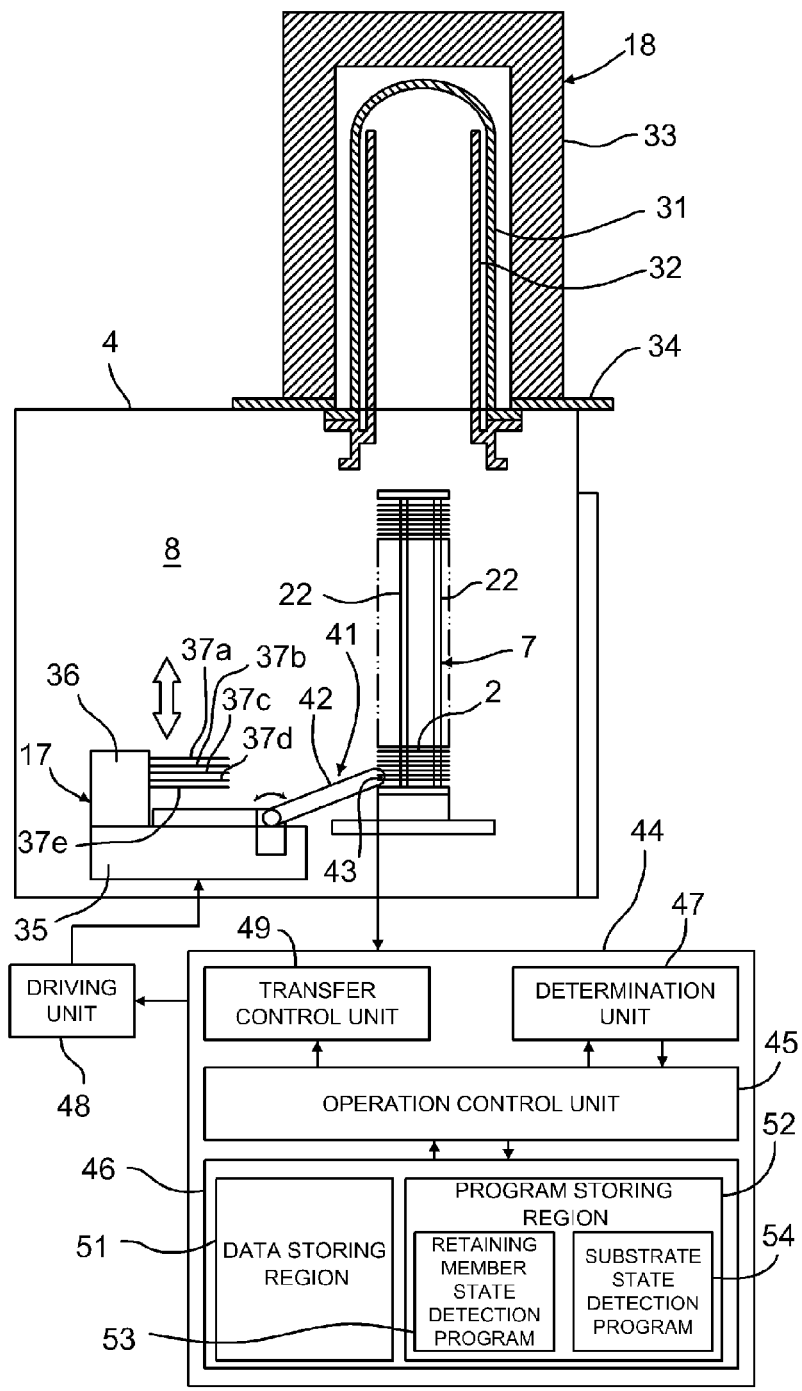
FIG. 4 is a cross-sectional view of a process furnace and its peripheral configuration included in a substrate processing apparatus according to an embodiment of the present invention.

FIG. 4 illustrates a peripheral configuration of the process furnace 18. The process furnace 18 includes an outer tube 31 formed of, for example, a heat-resistant material, such as quartz ($SiO_2$). The outer tube 31 has a cylindrical shape having a ceiling, in which an inner tube 32, the upper and lower ends of which are open, is concentrically arranged. On an outer circumferential surface of the outer tube 31, a heater 33, which is heating means, is concentrically arranged. The heater 33 is retained on the housing 4, and a heater base 34 is interposed between the heater 33 and the housing 4.

Figure 5:
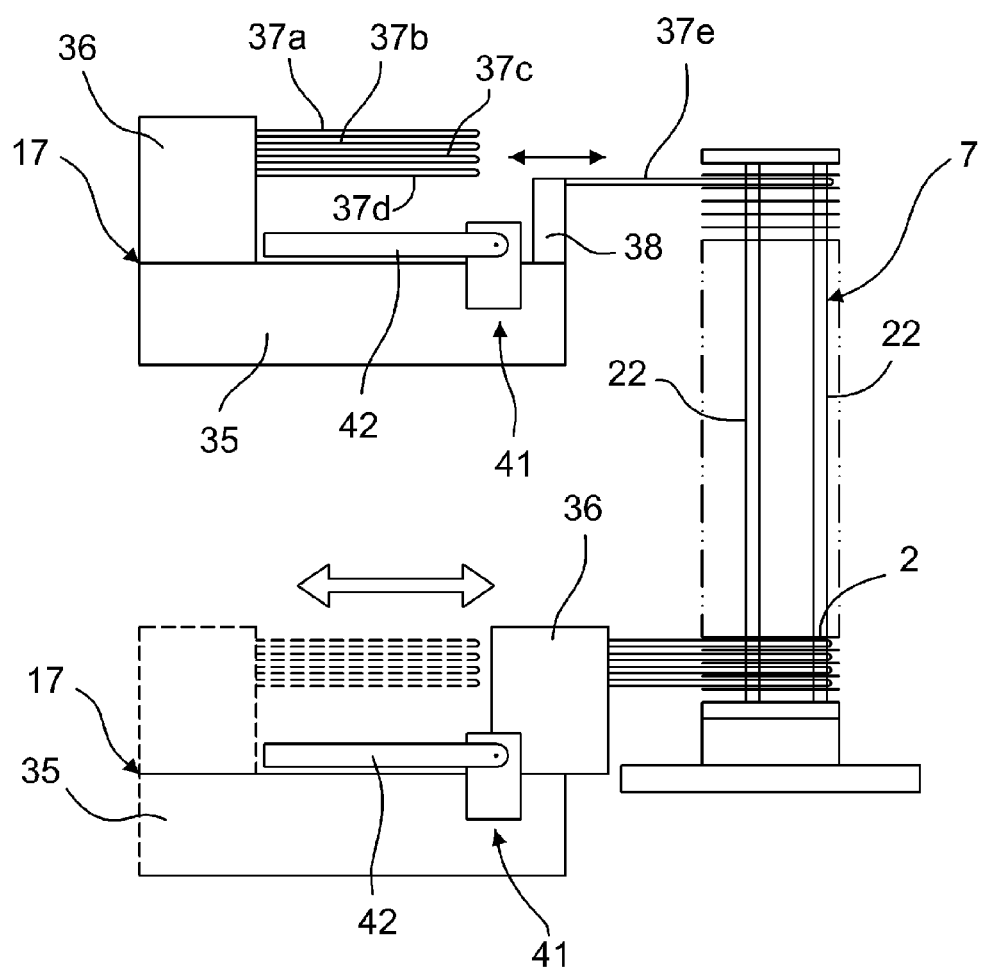
FIG. 5 is a side view of a substrate transfer mechanism included in a substrate processing apparatus according to an embodiment of the present invention.

As illustrated in FIG. 5, in the boat 7, the wafers 2 are retained on the plurality of wafer retaining rings 23 mounted therein. The wafer transfer machine 17 includes a transfer body 35 that moves vertically and rotates and a main tweezer body 36 that makes a reciprocal movement on the transfer body 35. On the main tweezer body 36, for example, four pairs of plate type tweezers 37a, 37b, 37c, and 37d are fixed to extend in parallel. Also, on the transfer body 35, a sub tweezer body 38 is installed such that it may not only make a reciprocal movement together with the main tweezer body 36 but also make a reciprocal movement independently from the main tweezer body 36. On the sub tweezer body 38, tweezers 37e are fixed in parallel to each other below the four pairs of tweezers 37a to 37d described above. Thus, as illustrated in FIG. 5, the wafer transfer machine 17 is capable of collectively transferring five wafers 2 by the five pairs of tweezers 37a to 37e, and transferring one monitor wafer using the lowermost tweezers 37e (single wafer transferring). In order to transfer a monitor wafer, distances among five collectively transferred wafers 2 are spaced by one slot, and the monitor wafer is unloaded from a cassette 3 that is different from those containing the wafers 2 and is then inserted among the five wafers 2, as illustrated in FIG. 5.

When, for example, twenty-five wafers 2 are accommodated in the cassette 3 and are to be transferred to or retrieved from the plurality of wafer retaining rings 23 in the boat 7 via the wafer transfer machine 17, five wafers 2 are collectively transferred or retrieved via the five tweezers 37a to 37e when there is no defective wafer retaining ring 23 among five wafer retaining rings 23 (a slot group) on which wafers 2 are placed or when there is no defective wafer 2. When there is a defective wafer retaining ring 23 or a defective wafer 2 in the slot group, only normal wafers 2 may be retrieved using the lowermost tweezers 37e. Also, one of monitor wafers may be retrieved at a time in a manner similar to a manner in which the monitor wafers are inserted among the five wafers 2.

Figure 6A:
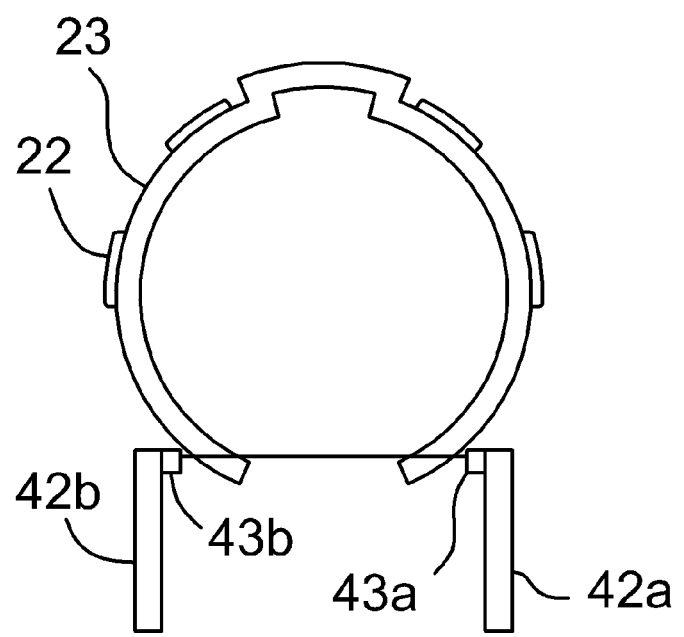
Figure 6B:
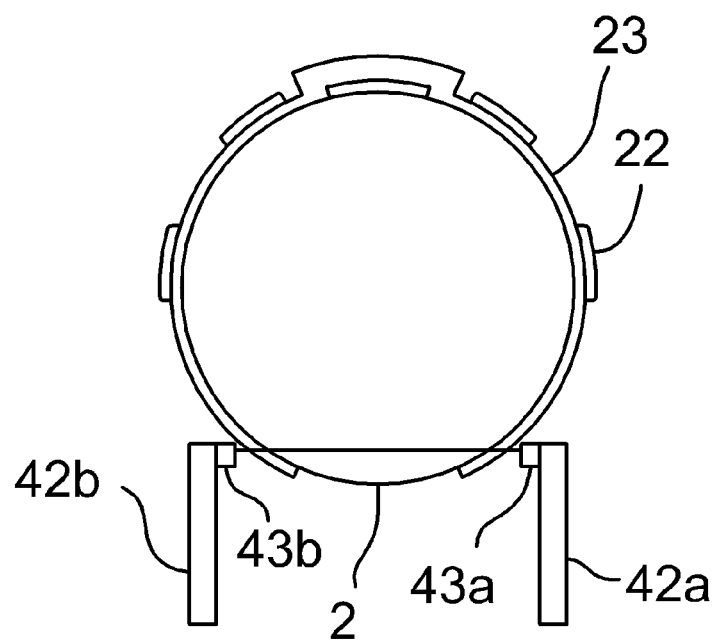

A detecting unit 41 configured to detect states of the wafers 2 and the wafer retaining rings 23 is installed on the transfer body 35. The detecting unit 41 includes two arms 42a and 42b disposed in parallel to each other, and photo sensors 43a and 43b. The arms 42a and 42b are installed at both sides of the transfer body 35 to be rotatable and pivotably moved together. Also, as illustrated in FIGS. 6A and 6B, transmissive photo sensors 43a and 43b, one of which is a transparent device and the other of which is a light-receiving device are installed near front ends of the arms 42a and 42b to be disposed at a front of the boat 7. States of the wafer retaining rings 23 and states of wafers 2 placed on the wafer retaining rings 23 are detected by the photo sensors 43a and 43b.

In order to detect the states of the wafer retaining rings 23 in the boat 7, the arms 42a and 42b are fixed on the boat 7 to be pivotably moved so that optical axes of the photo sensors 43a and 43b may pass through the wafer retaining rings 23, and the wafer transfer machine 17 is moved from a lower end of the boat 7 to an upper end of the boat 7 so as to monitor results of the detection output from the photo sensors 43a and 43b. When the wafers 2 are transferred to the boat 7 by the wafer transfer machine 17, the arms 42a and 42b are moved while pivoting to a side opposite to the boat 7 so as to prevent the boat 7 or the wafer retaining ring 23 from being interrupted by the arms 42a and 42b.

Even when the states of the wafers 2 placed on the wafer retaining rings 23 are detected, the optical axes of the photo sensors 43a and 43b are allowed to pass through the wafer retaining rings 23 and the wafers 2 placed on the wafer retaining rings 23, and the wafer transfer machine 17 is moved from the lower end of the boat 7 to the upper end of the boat 7 so as to monitor results of the detection output from the photo sensors 43a and 43b, similar to the method of detecting the states of the wafer retaining rings 23.

As illustrated in FIG. 4, analog signals output from the photo sensors 43a and 43b are output to a control apparatus 44 embodied as, for example, a computer, e.g., a personal computer (PC). The control apparatus 44 includes an operation controller unit 45, e.g., a central processing unit (CPU); a memory unit 46 including a memory, a hard disk drive (HDD), etc.; a determination unit 47 configured to obtain a detection value (which will be described in detail below) by performing signal processing, e.g., analog-to-digital (A/D) conversion, on data detected by the detecting unit 41, and compare the detection value with data stored in the memory unit 46; and a transfer control unit 49 configured to control the wafer transfer machine 17 (substrate transfer unit) via a driving unit 48 including, for example, a motor, based on a result of determination performed by the determination unit 47.

The memory unit 46 includes a data storing region 51 and a program storing region 52. The data storing region 51 is configured to store various data, e.g., master data which will be described in detail below. The program storing region 52 stores a retaining member state detection program 53 that causes the determination unit 47 to compare the master data with a detection value so as to detect a state of each of the wafer retaining rings 23, and a substrate state detection program 54 that causes the determination unit 47 to compare a detection value with the master data so as to detect a state of the wafer 2 placed on each of the wafer retaining rings 23. Although not shown, the data storing region 51 and the program storing region 52 further store various data and programs for performing substrate processing on the wafer 2.

When the states of the wafer retaining rings 23 and the state of the wafer 2 placed on each of the wafer retaining rings 23 are detected, first, the master data used for the determination unit 47 to perform determination is obtained and is then stored in the data storing region 51.

Figure 7:
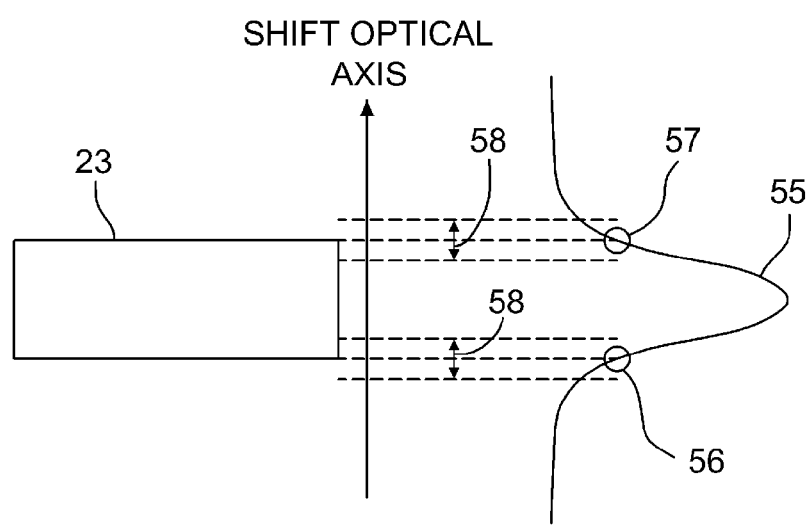
FIG. 7 is a diagram illustrating a case in which states of only retaining members are detected by a detecting unit included in a substrate transfer mechanism according to an embodiment of the present invention.

First, a process of obtaining first master data for detecting the state of each of the wafer retaining rings 23 will be described. After the wafer retaining rings 23 are installed in the boat 7, a plurality of pieces of waveform data 55 regarding the amount of light regarding the respective wafer retaining rings 23 while the wafers 2 are not placed thereon (non-wafer placed waveform data) as illustrated in FIG. 7 are obtained by moving the photo sensors 43a and 43b upward, and are then stored in the data storing region 51 such that the plurality of pieces of the waveform data 55 are associated with each of the wafer retaining rings 23 installed in the slots of the boat 7, respectively. Also, the determination unit 47 obtains the amount of light at lower ends of the wafer retaining rings 23, i.e., points at which the amount of light begins to decrease, as a lower ring reference value 56 and obtains the amount of light at upper ends of the wafer retaining ring 23, i.e., points at which the decreasing amount of light returns to its original value, as an upper ring reference value 57 based on the plurality of pieces of the non-wafer placed waveform data 55, and then stores the obtained values in the data storing region 51.

Also, a range in which the states of the wafer retaining rings 23 are considered normal, i.e., an allowed misalignment range (allowed ring misalignment range) 58, is set and stored in the data storing region 51. The first master data includes the lower ring reference value 56, the upper ring reference value 57, and the allowed ring misalignment range 58 stored in the data storing region 51, and is stored in the data storing region 51 such that it is associated with the slots of stages of the boat 7.

Figure 8:
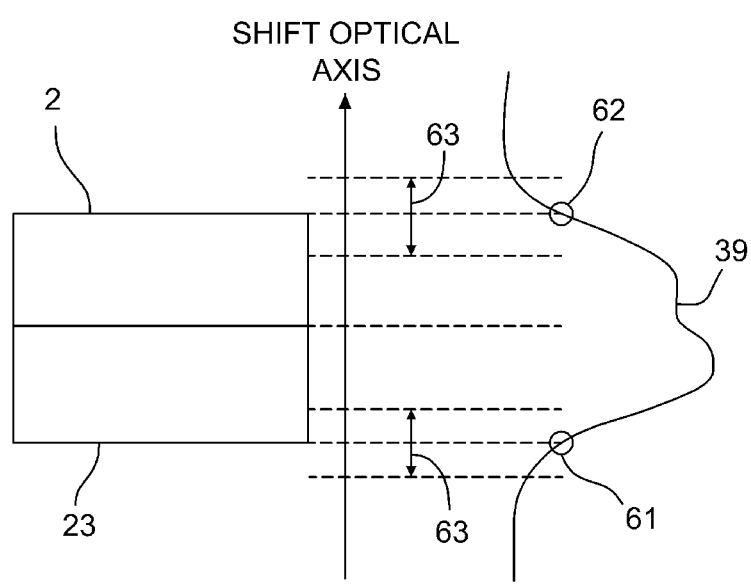
FIG. 8 is a diagram illustrating a case in which states of retaining members and a substrate placed on each of the retaining members are detected by a detecting unit included in a substrate transfer mechanism according to an embodiment of the present invention.

Next, a process of obtaining second master data for detecting the state of the wafer 2 will be described. After the wafer retaining rings 23 are installed in the boat 7, a plurality of pieces of waveform data 59 that are a mixture of waveform data of the wafer retaining rings 23 and waveform data of the wafer 2 while the wafer 2 is placed on each of the wafer retaining rings 23 (wafer-placed waveform data) as illustrated in FIG. 8 are obtained in units of slots serving as a mounting unit by moving the photo sensors 43a and 43b upward and are then stored in the data storing region 51 such that the plurality of pieces of waveform data 59 are associated with the slots. Also, the determination unit 47 obtains the amount of light at lower ends of the wafer retaining rings 23, i.e., points at which the amount of light begins to decrease, as a lower wafer reference value 61 and obtains the amount of light at an upper end of the wafer 2, i.e., points at which the decreasing amount of light returns to its original value, as an upper wafer reference value 62 based on the plurality of pieces of wafer-placed waveform data 59, and then stores the obtained values in the data storing region 51. Since the lower wafer reference value 61 is the same as the lower ring reference value 56, the lower wafer reference value 61 may be omitted.

Similar to the first master data, a range in which the state of the wafer 2 is considered normal, i.e., an allowed misalignment range (allowed wafer misalignment range) 63, is set and stored in the data storing region 51.

Also, since waveform data is obtained by passing optical axes of the photo sensors 43a and 43b through the wafer retaining rings 23 regardless of whether the wafer 2 is placed on each of the wafer retaining rings 23, the presence or absence of the wafer 2 cannot be determined based on merely whether the waveform data is present or not. Thus, information regarding whether the wafer 2 is present or not based on a configuration according to whether the wafer 2 is to be placed in each of the slots of the boat 7, is also needed. Also, the second master data used to detect a state of the wafer 2, e.g., whether the wafer 2 is present or not, a wafer crack, wafer dropping, etc., includes the information regarding whether the wafer 2 is present or not, the lower ring reference value 56, the upper ring reference value 57, the allowed ring misalignment range 58, the lower wafer reference value 61, upper wafer reference value 62, and the allowed wafer misalignment range 63. The second master data is stored in the data storing region 51 such that it is associated with the slots of the stages of the boat 7.

Example 1

Figure 9:
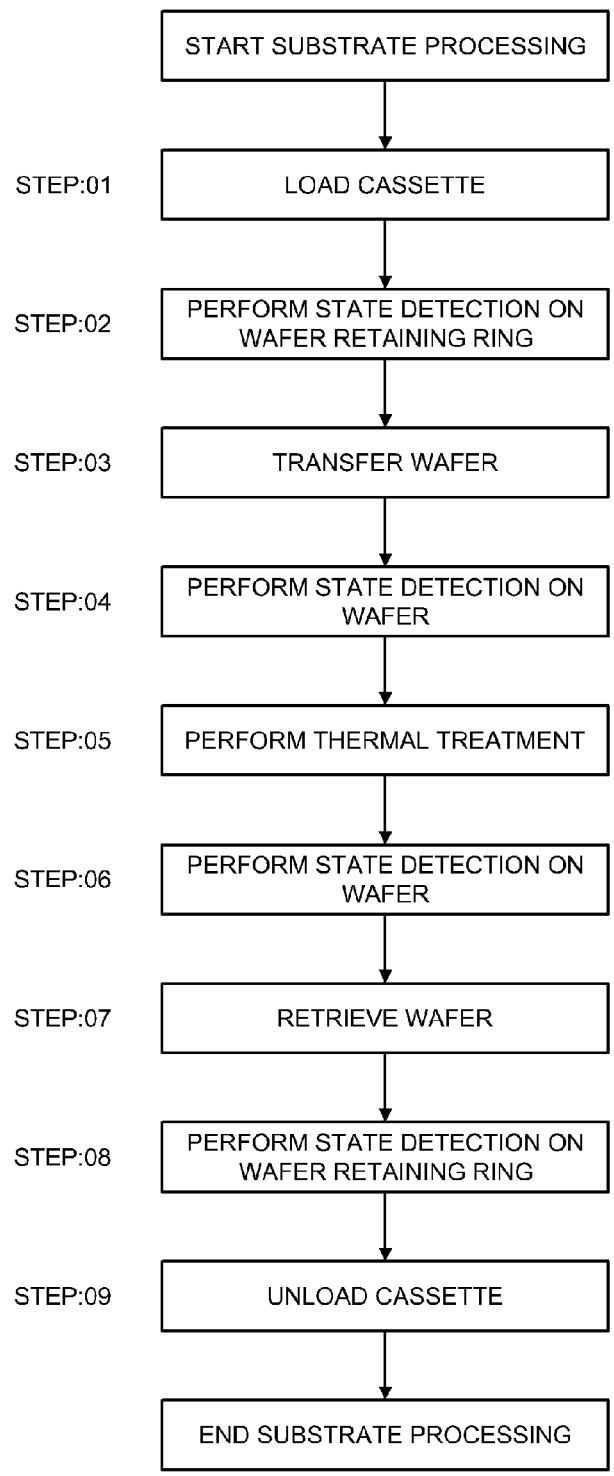
FIG. 9 is a flowchart illustrating a process of processing a substrate according to an embodiment of the present invention.
Figure 10:
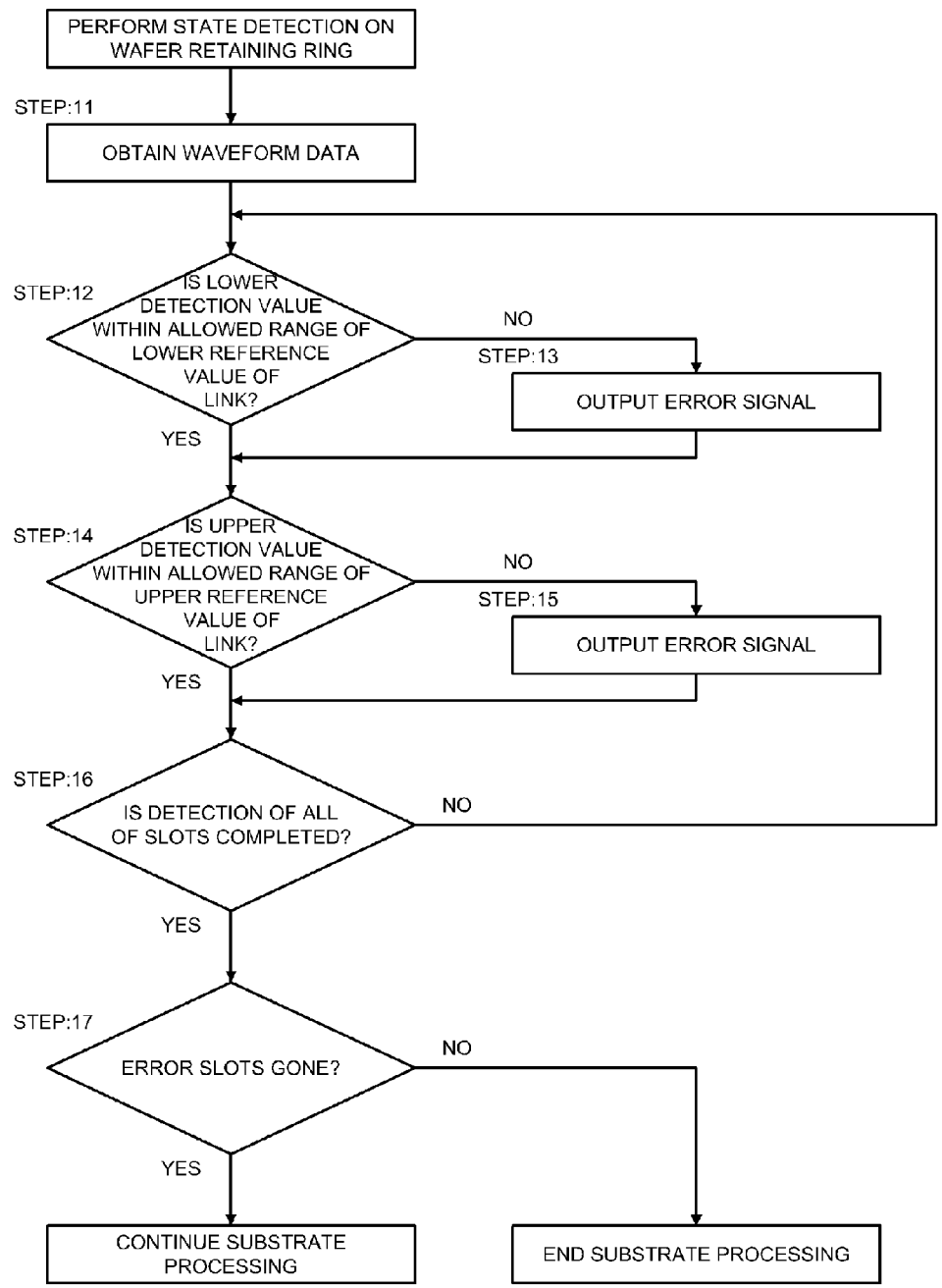
FIG. 10 is a flowchart illustrating a process of detecting states of retaining members according to an embodiment of the present invention.
Figure 11:
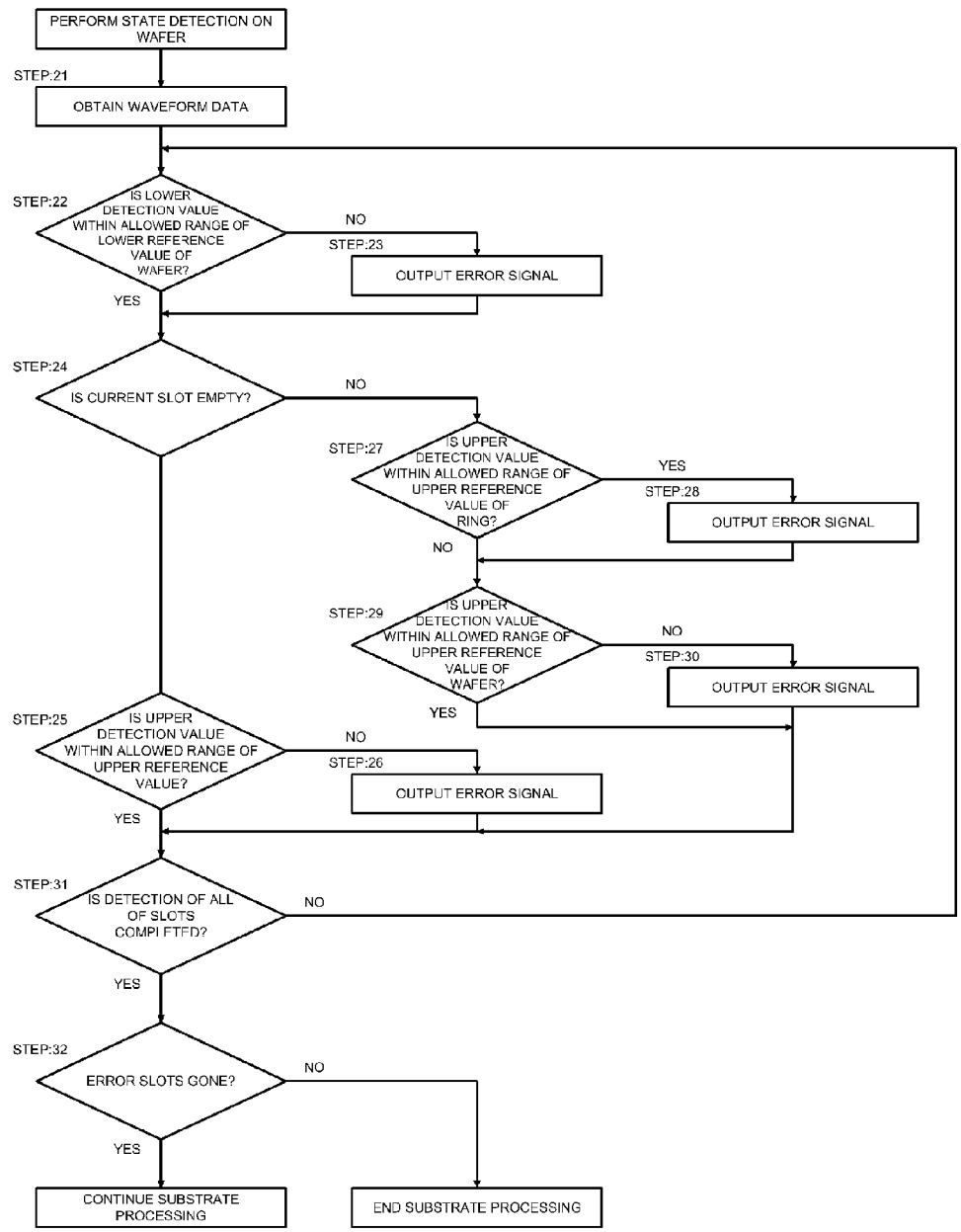
FIG. 11 is a flowchart illustrating a process of detecting states of retaining members and a substrate placed on each of the retaining members according to another embodiment of the present invention.

A first embodiment (first example) of the present invention will now be described with reference to flowcharts of FIGS. 9 to 11. FIG. 9 is a flowchart illustrating an operation of the substrate processing apparatus 1 according to an embodiment of the present invention. FIG. 10 is a flowchart illustrating a process of detecting states of the wafer retaining rings 23 according to an embodiment of the present invention. FIG. 11 is a flowchart illustrating a process of detecting states of the wafer retaining rings 23 and a state of the wafer 2 placed on each of the wafer retaining rings 23 according to another embodiment of the present invention. In the first embodiment, the states of the wafer retaining rings 23 and the wafer 2 are detected by running the retaining member state detection program 53 and the substrate state detection program 54, respectively, stored in the program storing region 52 by the operation controller unit 45.

Step 01

First, an operation of the substrate processing apparatus 1 starts by placing the cassettes 3 on the I/O stage 5 from the outside of the housing 4 through an automated guided vehicle (AGV), overhead hoist transfer (OHT), or the like. The cassettes 3 placed on the I/O stage 5 are transferred onto the cassette placing stages 9 and 11 by the cassette transfer device 14, or are temporarily stocked on the cassette self 6 and are then transferred onto the cassette placing stages 9 and 11 by the cassette transfer device 14. The lids of the cassettes 3 transferred onto the cassette placing stages 9 and 11 are removed by the cassette openers 12 and 13, and atmospheres in the cassettes 3 are communicated with the airtight chamber 8.

Step 02

Then, the retaining member state detection program 53 is run by the operation controller unit 45. Once the retaining member state detection program 53 is run, the process of detecting states of the wafer retaining rings 23 installed in the boat 7 (hereinafter referred to as Steps 11 to 17 to be described below) is performed according to the flowchart of FIG. 10.

Step 11

Once the process of detecting the state of the wafer retaining ring 23 starts, the transfer control unit 49 drives the wafer transfer machine 17 via the driving unit 48 according to a command given from the operation controller unit 45 configured to run the retaining member state detection program 53, and waveform data of the wafer retaining rings 23 installed in the slots of the boat 7 is obtained by the photo sensors 43a and 43b and is then stored in the data storing region 51 such that the waveform data is associated with the slots.

Step 12

After the waveform data of the wafer retaining rings 23 is obtained, a lower ring detection value representing the amount of light at points at which the amount of light starts to decrease is obtained from the waveform data, and is compared with the first master data by the determination unit 47 to determine whether the lower ring detection value is the same as the lower ring reference value 56 or falls within the allowed ring misalignment range 58.

Step 13

When an error occurs in one of the wafer retaining rings 23, e.g., when the wafer retaining ring 23 is distorted or is not installed in the boat 7, it is determined in Step 12 that the lower ring detection value does not fall within the allowed ring misalignment range 58, and thus an error signal is output for the slot into which the wafer retaining ring 23, the state of which is detected is installed.

Step 14

After it is determined in Step 12 that the lower ring detection value is the same as the lower ring reference value 56 or falls within the allowed ring misalignment range 58 or after the error signal is output in Step 13, an upper ring detection value representing the amount of light at points at which the amount of light returns to its original value is obtained from the waveform data of the wafer retaining rings 23 and is compared with the first master data by the determination unit 47 to determine whether the upper ring detection value is the same as the upper ring reference value 57 or falls within the allowed ring misalignment range 58.

Step 15

When an error occurs in one of the wafer retaining rings 23, e.g., when the wafer retaining ring 23 is distorted or is not installed in the boat 7, or when the wafer 2 is placed on each of the wafer retaining rings 23, it is determined in Step 14 that the upper ring detection value does not fall within the allowed ring misalignment range 58, and an error signal is output for the slot in which the wafer retaining ring 23, the state of which is detected, is installed.

Step 16

After it is determined in Step 14 that the upper ring detection value is the same as the upper ring reference value 57 or falls within the allowed ring misalignment range 58 or after the error signal is output in Step 15, it is determined whether the states of the wafer retaining rings 23 installed in all of the slots are detected. When the states of the wafer retaining rings 23 are not detected in all of the slots, Steps 12 to 15 are performed on the wafer retaining ring 23 installed in a subsequent slot.

Step 17

If it is determined in Step 16 that the states of the wafer retaining rings 23 in all of the slots are detected, it is determined whether there is a slot regarding which an error signal is output. Substrate processing is continued when there is no slot for which the error signal is output, and is suspended when there is a slot for which the error signal is output and a recovery process of, for example, exchanging the wafer retaining ring 23 corresponding to the error signal is performed by a user.

Step 03

When a result of performing the process of detecting the states of the wafer retaining rings 23 in Step 02 reveals no abnormal states, substrate processing is continued, and the wafers 2 are unloaded from the cassettes 3, the atmospheres of which are communicated with the airtight chamber 8 by the wafer transfer machine 17. The locations of the unloaded wafers 2 are adjusted by the substrate location adjustment apparatus 16 such that notches or orientation flats thereof may be stabilized to a desired location, and are then returned into the boat 7.

Step 04

After the wafers 2 are transferred into the boat 7, the substrate state detection program 54 is run to perform a process of detecting the state of the wafer 2 placed on each of the wafer retaining rings 23 (Steps 21 to 32) illustrated in the flowchart of FIG. 11.

Step 21

When the process of detecting the state of the wafer 2 placed on each of the wafer retaining rings 23 starts, the transfer control unit 49 drives the wafer transfer machine 17 via the driving unit 48 based on a command given from the operation controller unit 45 configured to run the substrate state detection program 54, and waveform data representing the amount of light at the wafer retaining rings 23 and the amount of light at the wafer 2 placed on each of the wafer retaining rings 23 is obtained by the photo sensors 43a and 43b and is then stored in the data storing region 51 such that the waveform data is associated with the slots into which the wafer retaining rings 23 are installed.

Step 22

After the waveform data is obtained, a lower wafer detection value representing the amount of light at a point at which the amount of light starts to decrease is obtained from the waveform data and is then compared with the second master data by the determination unit 47 to determine whether the lower wafer detection value is the same as the lower wafer reference value 61 or falls within the allowed wafer misalignment range 63.

Step 23

When an error occurs in one of the wafer retaining rings 23, it is determined in Step 22 that the lower wafer detection value does not fall within the allowed wafer misalignment range 63, and an error signal is output for the slot into which the wafer retaining ring 23, the state of which is detected, is inserted.

Step 24

After it is determined in Step 22 that the lower wafer detection value is the same as the lower wafer reference value 61 or falls within the allowed wafer misalignment range 63 or after the error signal is output in Step 23, it is determined whether the wafer 2 is placed on the wafer retaining ring 23 in a current slot based on the information regarding whether the wafer 2 is present or not.

Step 25

When it is determined in Step 24 that the wafer 2 is not placed on the wafer retaining ring 23 in the current slot, an upper ring detection value representing the amount of light at the points at which the amount of light returns to its original value is obtained from the waveform data of the wafer retaining ring 23 and is then compared with the second master data by the determination unit 47 to determine whether the upper ring detection value is the same as the upper ring reference value 57 or falls within the allowed ring misalignment range 58.

Step 26

When an error occurs in one of the wafer retaining rings 23 or the wafer 2 is placed on each of the wafer retaining rings 23, it is determined in Step 25 that the upper ring detection value does not fall within the allowed ring misalignment range 58, and an error signal is thus output for the slot in which the wafer retaining ring 23, the state of which is detected, is installed.

Step 27

When it is determined in Step 24 that the wafer 2 is placed on the wafer retaining ring 23 installed in the slot, an upper wafer detection value representing the amount of light at the point at which the amount of light returns to its original value is obtained from the waveform data of the wafer retaining ring 23 and the waveform data of the wafer 2 placed on the wafer retaining ring 23. The upper wafer detection value is compared with the second master data by the determination unit 47 to determine whether the upper wafer detection value is the same as the upper ring reference value 57 or falls within the allowed ring misalignment range 58.

Step 28

Since when the wafer 2 is not placed on the wafer retaining ring 23, it is determined in Step 27 that the upper wafer detection value is the same as the upper ring reference value 57 or falls within the allowed ring misalignment range 58, an error signal is output for the slot in which the wafer retaining ring 23, the state of which is detected, is installed.

Step 29

After it is determined in Step 27 that the upper wafer detection value does not fall within the allowed ring misalignment range 58 or after the error signal is output in Step 28, the upper wafer detection value is compared with the second master data by the determination unit 47 to determine whether the upper wafer detection value is the same as the upper wafer reference value 62 or falls within the allowed wafer misalignment range 63.

Step 30

When an error occurs in the wafer 2, e.g., when the wafer 2 is dropped out of the wafer retaining ring 23 or a crack occurs in the wafer 2, it is determined in Step 29 that the upper wafer detection value does not fall within the allowed wafer misalignment range 63, and an error signal is thus output for the slot in which the wafer retaining ring 23, the state of which is detected, is installed.

Step 31

After it is determined in Step 25 that the upper ring detection value is the same as the upper ring reference value 57, after the error signal is output in Step 26, after it is determined in Step 29 that the upper wafer detection value falls within the allowed wafer misalignment range 63, or after the error signal is output in Step 30, it is determined whether the states of the wafers 2 are detected for all of the slots. When the states of the wafers 2 are not detected for all of the slots, Steps 22 to 30 are performed on the wafer 2 placed on a wafer retaining ring 23 installed in a subsequent slot.

Step 32

When it is determined in Step 31 that the states of the wafers 2 are detected for all of the slots, it is determined whether there is a slot for which the error signal is output. Substrate processing is continued when it is determined that there is no slot for which the error signal is output, and is suspended when it is determined that there is a slot for which the error signal is output and a recovery process of, for example, exchanging the wafer retaining ring 23 corresponding to the error signal or unloading the wafer 2 from the wafer retaining ring 23 is performed by a user.

Step 05

When a result of performing the process of detecting the states of the wafers 2 placed on each of the wafer retaining rings 23 reveals no abnormal states in Step 04, substrate processing is continued. Then, the boat 7 to which the wafers 2 are transferred is loaded into the process furnace 18 via the boat elevator 21 by opening the furnace port gate valve 19 of the process furnace 18, and a predetermined treatment is performed on the wafers 2 in the process furnace 18.

Step 06

After the predetermined treatment is performed on the wafers 2 in the process furnace 18, the boat 7 is unloaded from the process furnace 18 and is then cooled to a predetermined temperature. Then, by running the substrate state detection program 54, the process of detecting the states of the wafers 2 (Steps 21 to 32 illustrated in FIG. 11) is performed again.

Step 07

When a result of the process of detecting the states of the wafers 2 performed in Step 06 reveals no abnormal states, substrate processing is continued, and the wafers 2 are retrieved from the boat 7 through the wafer transfer machine 17 and are returned into the cassettes 3.

Step 08

After the retrieval of the wafers 2, the retaining member state detection program 53 is run again to perform the process of detecting the states of the wafer retaining rings 23 installed in the boat 7 (i.e., Steps 11 to 17 illustrated in FIG. 10) again.

Step 09

When a result of the process of detecting the states of the wafer retaining rings 23 performed in Step 08 reveals no abnormal states, substrate processing is continued, the cassettes 3 are unloaded to the outside of the housing 4 from the cassette placing stages 9 and 11 via the I/O stage 5 by the cassette transfer device 14, and then substrate processing is ended.

Although in the example 1, substrate processing is suspended when an error is detected when the states of the wafer retaining rings 23 or the states of the wafers 2 are detected, for example, wafers 2 may be transferred onto or retrieved from only normal wafer retaining rings 23 from which no error is detected, or only normal wafers 2 from which no error is detected may be retrieved from the boat 7 and transferred to the cassettes 3.

The following advantages may be achieved according to the first embodiment (example 1) of the present invention.

According to the first embodiment, when the wafers 2 are placed on the wafer retaining rings 23 installed in the boat 7, since both the states of the wafer retaining rings 23 and the states of the wafers 2 placed on the wafer retaining rings 23 may be detected, both an error caused by the wafer retaining rings 23 and an error caused by the wafers 2 may be detected beforehand.

Also, according to the first embodiment, a detection value for each of the wafer retaining rings 23 is compared with the first master data including a reference value for normal wafer retaining rings 23 and the like to determine each of the states of the wafer retaining rings 23 by the determination unit 47 and detect the states of the wafer retaining ring 23, and substrate processing is suspended when any of the wafer retaining rings 23 has an abnormal state. Thus, the occurrence of particles or overturning of the boat 7 caused when an abnormal wafer retaining ring 23 collides against the tweezers 37a to 37e of the wafer transfer machine 17 may be prevented.

Also, according to the first embodiment, data obtained by detecting the states of the wafer retaining rings 23 may be accumulated to be used to analyze deformation of the wafer retaining rings 23 after substrate processing is performed or according to a number of times that substrate processing is performed. Based on a result of analyzing deformation of the wafer retaining rings 23, a reference value representing a maintenance cycle of exchanging the wafer retaining rings 23 may be determined. By determining the reference value for the maintenance of the wafer retaining rings 23, when an error exceeding the reference value is detected while detecting the states of the wafer retaining rings 23, this fact may be reported to a user using an alarm so that the maintenance of the wafer retaining rings 23 may be performed without wasting time, thereby improving the efficiency of a work.

Also, according to the first embodiment, a detection value for the wafer 2 is compared with the second master data including a reference value representing a normal wafer 2 or a normal wafer retaining ring 23 to determine the state of the wafer 2 by the determination unit 47. Thus, the state of the wafer 2 may be detected even when the wafer 2 is placed on the wafer retaining ring 23.

Also, according to the first embodiment, substrate processing is suspended when a defect, such as a crack or deformation, occurs in the wafer 2, thereby preventing the boat 7 from being overturned due to a collision between the wafer 2 that has a crack or that deforms and the tweezers 37a to 37e.

Also, according to the first embodiment, the state of the wafer 2 may be detected using a mechanism for detecting the states of the wafer retaining rings 23, and no additional mechanism is required to detect the state of the wafer 2, thereby saving detection costs.

Example 2

Figure 12:
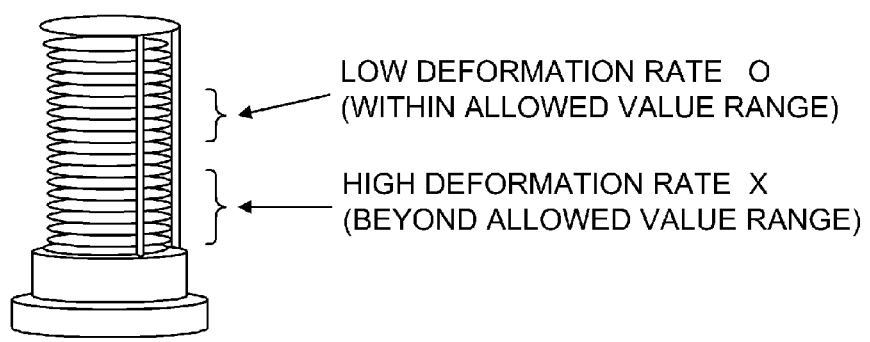
FIG. 12 is a diagram illustrating a variation in a determination result of state detection due to different deformation rates of retaining members installed in respective slots of a substrate retaining mechanism and a substrate placed on each of the retaining members according to an example of the present invention.

Next, a second embodiment (example 2) of the present invention will be described with reference to FIGS. 12 and 13. The substrate processing apparatus 1 and the control apparatus 44 and the flowcharts of FIGS. 9 and 10 mentioned above to describe example 1 may also be applied to the second embodiment (example 2).

First, different deformation rates of the slots of the boat 7 will be described with reference to FIG. 12.

A deformation of the wafer retaining ring 23 serving as a retaining member or a crack in the wafer 2 placed on the wafer retaining ring 23 is detected by calculating the difference between master data and detection data that is actually measured and by determining a result of the calculating, based on a permissible detection range (which corresponds to the allowed ring misalignment range 58 or the allowed wafer misalignment range 63 in example 1). During the detection of a deformation of the wafer retaining ring 23 or a crack in the wafer 2 placed on the wafer retaining ring 23, there is a case in which state detection cannot be performed when a parameter (master data) is fixed to one allowed value (the allowed ring misalignment range 58 or the allowed wafer misalignment range 63), due to the different deformation rates of a central portion, a top portion, and a bottom portion of the boat 7. To solve this problem, a structure configured to detect a deformation of the wafer retaining ring 23 or a crack in the wafer 2 placed on the wafer retaining ring 23 in units of the slots of the boat 7 (or in units of the wafer retaining rings 23 installed in the respective slots of the boat 7) is needed.

First, detection of deformation of the wafer retaining ring 23 will be described. Deformation of the wafer retaining ring 23 is detected by determining whether detection data that is actually measured falls within a permissible detection range range (the allowed ring misalignment range 58) based on master data. However, since only one permissible detection range is used, there is a case in which deformation of the wafer retaining rings 23 cannot be exactly detected when deformation rates of the wafer retaining rings 23 installed in the respective slots of the boat 7 are different.

Figure 13:
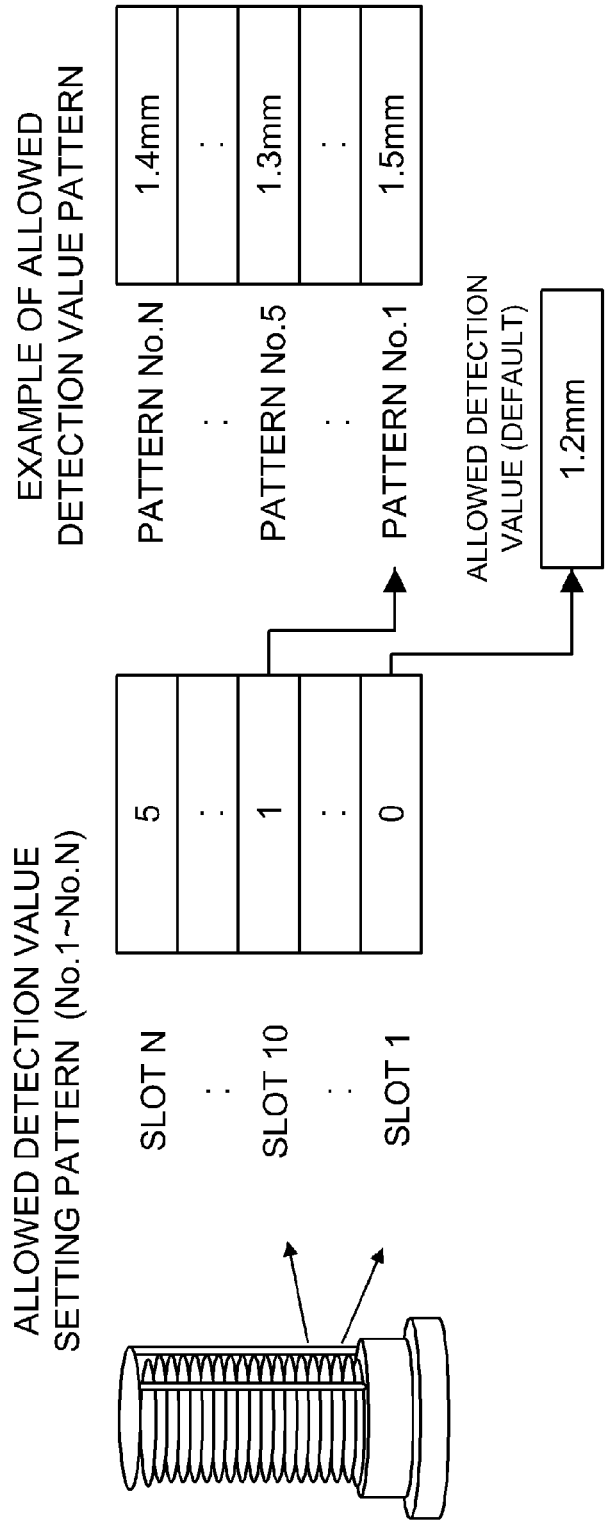
FIG. 13 is a diagram illustrating setting an allowed value range for performing state detection on respective slots of a substrate retaining mechanism according to example 2 of the present invention.

FIG. 13 is a diagram illustrating setting a permissible detection range to be used in detecting deformation of the wafer retaining ring 23 and a crack in the wafer 2 placed on the wafer retaining ring 23 based on a permissible detection range setting pattern set for all of the slots of the boat 7 according to example 2 of the present invention. Although not shown, all permissible detection range setting patterns and permissible detection range patterns have been stored in the memory unit 46 (the data storing region 51) beforehand.

In the second embodiment, an allowed ring detection value setting pattern is prepared for all of the slots of the boat 7 so that an allowed ring detection value pattern No. may be set. When the allowed ring detection value pattern No. is set to '0', a default permissible detection range is used. When the allowed ring detection value pattern No. is set to a value other than '0,' an allowed value that is set for a corresponding allowed ring detection value pattern is used. Thus, permissible detection ranges may be set for the slots of the boat 7, respectively, and an allowed value for all slots assigned the same pattern may be set by changing the allowed value corresponding to an allowed ring detection value pattern. Also, the flowchart of FIG. 9 is performed to detect deformation of the wafer retaining rings 23, similar to example 1. The flowchart of FIG. 9 has already been described above with respect to example 1 and will not be described again here.

Similarly, during detection of a crack in the wafer 2 placed on each of the wafer retaining rings 23 according to the second embodiment, an allowed wafer crack detection value setting pattern is prepared for all of the slots of the boat 7 so that an allowed wafer crack detection value pattern No. may be set. When the allowed wafer crack detection value pattern No. is set to '0', a default permissible detection range is used. When the allowed wafer crack detection value pattern No. is set to a value other than '0', an allowed value that is set for a corresponding allowed wafer crack detection value pattern is used. Thus, permissible detection ranges may be set for all of the slots of the boat 7, and an allowed value may be set for all slots assigned the same pattern by changing an allowed value for an allowed wafer crack detection value pattern. The flowchart of FIG. 10 is performed to detect a crack in the wafer 2 placed on each of the wafer retaining rings 23, similar to example 1. The flowchart of FIG. 10 has already been described above with respect to example 1 and will not be described again here.

In a method of using the permissible detection range patterns (an allowed ring crack detection value pattern and an allowed wafer crack detection value pattern) according to the second embodiment, an allowed value setting pattern and an allowed value pattern can be assigned to set precise upper and lower values to detect deformation of the wafer retaining rings 23 and precise upper and lower values to detect a crack in the wafer 2 placed on each of the wafer retaining rings 23.

The second embodiment (example 2) has not only the advantages of the first embodiment described above but also advantages to be described below.

During ring deformation detection and wafer crack detection, permissible detection ranges may be set for all of the slots of the boat 7 regardless of the locations of the slots. Thus, ring deformation detection and wafer crack detection may be performed even when deformation rates in the slots are different.

Since ring deformation in the boat 7 and wafer cracking may be detected, the occurrence of an error in the detection caused by different deformation rates in the slots of the boat 7 may be prevented, thereby preventing an undesirable error from occurring and substrate processing from being unnecessarily suspended.

Example 3

Figure 14:
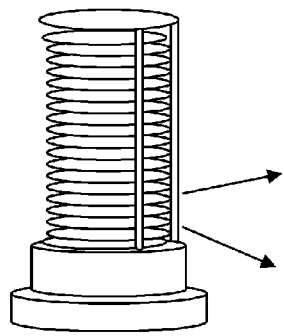
FIG. 14 is a diagram illustrating setting an allowed value range for performing state detection on respective slots of a substrate retaining mechanism based on types of wafers according to example 3 of the present invention.

Next, a third embodiment (example 3) of the present invention will be described with reference to FIG. 14. The substrate processing apparatus 1, the control apparatus 44 and the flowcharts of FIGS. 9 and 10 mentioned above to describe example 1 may also be applied to the third embodiment (example 3).

First, a thickness reference value pattern determined in consideration of a different deformation rate according to the type of a wafer will be described with reference to FIG. 14. Since a result of detecting a crack in the wafer 2 placed on each of the wafer retaining rings 23 may vary according to a thickness of the wafer 2, i.e., the type of the wafer 2, a reference value for a thickness reference value pattern is set according to the type of the wafer 2. In other words, the thickness reference value pattern is determined based on whether detection data falls within a range between (master data+thickness reference value according to wafer type+permissible detection range for each of the slots of the boat 7) and (master data+thickness reference value according to wafer type−permissible detection range for each of the slots). The flowchart of FIG. 10 is performed to detect a crack in the wafer 2 placed on each of the wafer retaining rings 23, similar to example 1. Example 3 is different from example 1 in that such allowed ranges mentioned above with reference to FIG. 10 are replaced with the formula described above. The subsequent processing is the same as in example 1 and will not be described again here.

Thus, the type of the wafer 2 placed on the wafer retaining ring 23 in a target slot may be determined during detection of a crack in the wafer 2, and the occurrence of an error in a result of the detection caused by a different type of the wafer 2 may be prevented by adding the thickness reference value to the result of the detection. This method may also be applied to wafer crack detection performed in units of slots, which is included in a conventional wafer crack detection method that does not use a ring boat.

The third embodiment (example 3) has not only the advantages of the first embodiment (example 1) described above and the second embodiment (example 2) but also advantages to be described below.

In the case of wafer crack detection, an error in a result of performing the wafer crack detection caused by a different type of wafer may be prevented by adding a thickness reference value according to the type of wafer to the result of performing the wafer crack detection.

This method may also be applied to wafer crack detection performed in units of slots, which is included in a conventional wafer crack detection method that does not use a ring boat, and does not require any particular configuration, thereby reducing manufacturing costs.

The substrate processing apparatus 1 according to an embodiment of the present invention may be applied to not only a semiconductor manufacturing apparatus but also an apparatus for processing a glass substrate, such as a liquid crystal display (LCD) apparatus. Furthermore, the substrate processing apparatus 1 may be applied to various apparatuses, such as an exposure apparatus, a lithography apparatus, a coating apparatus, and a plasma-based processing apparatus.

Chemical vapor deposition (CVD), physical vapor deposition (PVD), atomic layer deposition (ALD), a treatment for forming an oxide film or a nitride film, or a film containing a metal may be used to form a film.

Supplementary Notes

The present invention may include embodiments to be described below.

Supplementary Note 1

According to an embodiment of the present invention, there is provided a substrate processing apparatus comprising: a substrate retaining mechanism having a retaining member for placing a substrate thereon; a substrate transfer unit configured to transfer the substrate; a detecting unit configured to detect a state of the retaining member; a determination unit configured to compare a data obtained by the detecting unit with a master data obtained by the detecting unit to determine the state of the retaining member, the data representing the state of the retaining member, and the master data representing a normal state of the retaining member; and a transfer control unit configured to control the substrate transfer unit based on a determination result of the determination unit.

Supplementary Note 2

According to another embodiment of the present invention, there is provided a non-transitory recording medium recording a retaining member state detection program executed by a substrate processing apparatus which includes at least a substrate retaining mechanism in which a retaining member on which a substrate is placed is installed, a substrate transfer unit configured to transfer the substrate, and a transfer control unit configured to control the substrate transfer unit, the computer readable storage medium recording the retaining member state detection program including a first step of controlling a detection unit, which is configured to detect a state of the retaining member, to obtain waveform data; a second step of controlling a determination unit to obtain data representing an upper end and a lower end of each of the retaining members from the waveform data; a third step of controlling the determination unit, to compare master data obtained by detecting a normal state of the retaining member with the waveform data to determine the state of the retaining member; and a fourth step of suspending substrate processing when an error is detected in the third step.

Supplementary Note 3

According to still another embodiment of the present invention, there is provided a substrate processing apparatus including a retaining member on which a substrate is placed; a substrate retaining mechanism in which the retaining member is installed to retain the substrate; a detecting unit configured to detect a state of the retaining member installed in the substrate retaining mechanism and a state of the substrates placed on the retaining member; a determination unit configured to compare detection data obtained by the detecting unit with second master data which is reference data obtained by detecting a normal state of the retaining member and a normal state of the substrate placed on the retaining member so as to determine the state of the substrate; and a substrate transfer unit configured to transfer the substrate into the substrate retaining mechanism based on a determination result of the determination unit.

Supplementary Note 4

In the substrate processing apparatus according to supplementary note 1 or 3, the substrate retaining mechanism comprises a predetermined number of mounting units into which the retaining member is installed, and the determination unit compares the data with the master data the predetermined number of times.

Supplementary Note 5

In the substrate processing apparatus according to supplementary note 4, the substrate is repeatedly transferred onto the retaining member when the retaining member is in the normal state according to the determination result of the determination unit.

Supplementary Note 6

In the substrate processing apparatus according to supplementary note 4, the substrate transfer unit is put into standby until a process of releasing an abnormal state of the retaining member is completed when the retaining member is in the abnormal state according to the determination result of the determination unit.

Supplementary Note 7

According to another embodiment of the present invention, there is provided a substrate state detection program executed by a substrate processing apparatus, the substrate state detection program causing a detecting unit, which is configured to detect a state of a retaining member and a state of substrate placed on the retaining member, to obtain waveform data; and causing a determination unit to obtain data representing a lower end and an upper end of the retaining member from the waveform data, to compare the obtained data with second master data, which is reference data obtained by a normal state of the retaining member and a normal state of the substrate placed on the retaining member, to determine a state of the retaining member and a state of the substrate, wherein substrate processing is suspended when it is determined based on the determination that an error is detected.

Supplementary Note 8

According to another embodiment of the present invention, there is provided a method of transferring a substrate, including at least a transfer process of transferring substrates into a substrate retaining mechanism in which a retaining member is installed, the method including a data obtaining process of causing a detection unit to obtain data representing a lower end and an upper end of the retaining member while a substrate is placed on the retaining members; and a determination process of causing a determination unit to compare the data obtained through the data obtaining process with second master data, which is reference data obtained by detecting a normal state of the retaining member and a normal state of the substrate placed on the retaining member, to determine a state of the retaining member and a state of the substrate, wherein substrate processing is suspended when an error is detected during the determination process.

Supplementary Note 9

According to another embodiment of the present invention, there is provided a semiconductor device manufacturing method including at least a transfer process of transferring substrates into a substrate retaining mechanism in which a retaining member is installed, the method including a data obtaining process of causing a detection unit to obtain data representing a lower end and an upper end of the retaining member while a substrate is placed on the retaining member; and a determination process of causing a determination unit to compare the data obtained through the data obtaining process with second master data, which is reference data obtained by detecting a normal state of the retaining member and a normal state of the substrate placed on the retaining member, to determine a state of the retaining member and a state of the substrate, wherein substrate processing is suspended when an error is detected during the determination process.

Supplementary Note 10

The substrate processing apparatus according to supplementary note 1, further including a memory unit configured to store first master data including at least reference data for location of the retaining member, and second master data including at least reference data for location of the substrate placed on the substrate retaining member.

Supplementary Note 11

The substrate processing apparatus according to supplementary note 10 may further include a memory unit configured to store the master data, wherein the memory unit stores a permissible detection range setting pattern for finely adjusting a permissible detection range set for each of slots of the substrate retaining mechanism, and a permissible detection range pattern for setting the permissible detection range.

Supplementary Note 12

The substrate processing apparatus according to supplementary note 10 or 11 may further include a memory unit configured to store a reference value pattern for changing a permissible detection range according to a type of the substrate.

What is claimed is:

1. A substrate processing apparatus comprising:
   a substrate retaining mechanism comprising a predetermined number of retaining members for placing substrates thereon and a predetermined number of slots into which the predetermined number of retaining members are inserted;
   a substrate transfer unit configured to transfer the substrate;

a detecting unit configured to detect states of the retaining members and states of the substrates placed on the retaining members; and a control apparatus comprising: a determination unit configured to compare data obtained by the detecting unit with a master data to determine the states of the retaining members and the substrates placed on the retaining members, the data representing the states of the retaining members and the substrates placed on the retaining members, and the master data representing normal states of the retaining members and normal states of the substrates placed on the retaining members;

a transfer control unit configured to control the substrate transfer unit based on a determination result of the determination unit; and a memory unit configured to store a first master data including a reference data for location of the retaining members and a second master data including a reference data for location of the substrates placed on the substrate retaining members, wherein the determination unit is configured to compare a first waveform data obtained from detecting the states of the retaining members by the detecting unit to the first master data stored in the memory unit, wherein the transfer control unit is configured to control the substrate transfer unit to transfer the substrates to the retaining members when the retaining members are determined to be in the normal state according a result of comparison between first waveform data and the first master data, wherein the control apparatus is configured to suspend processing of the substrates when the retaining members are determined to be in an abnormal state according the result of comparison between first waveform data and the first master data, and wherein the determination unit is further configured to compare a second waveform data obtained from detecting the states of the substrates placed on the retaining members by the detecting unit to the second master data stored in the memory unit after the substrates are transferred to the retaining members.

2. The substrate processing apparatus of claim 1, wherein the determination unit is further configured to compare the data with the master data a predetermined number of times.

3. The substrate processing apparatus of claim 1, wherein the substrates are repeatedly transferred onto the retaining members when the retaining members are in the normal state according to the result of the comparison between the first waveform data and the first master data.

4. The substrate processing apparatus of claim 1, wherein the substrate transfer unit is put into standby until a process of releasing the abnormal state of the retaining members is completed when the retaining members are determined to be in the abnormal state according to the result of the comparison between the first waveform data and the first master data.

5. The substrate processing apparatus of claim 1,
wherein the memory unit is configured to store a permissible detection range setting pattern for finely adjusting a permissible detection range set for each of the slots of the substrate retaining mechanism, and a permissible detection range pattern for setting the permissible detection range.

6. The substrate processing apparatus of claim 5, wherein the memory unit is further configured to store a reference value pattern for changing the permissible detection range according to types of the substrates.

7. The substrate processing apparatus of claim 1, further comprising a memory unit configured to store a thickness reference value for calculating a permissible detection range for each type of the substrates.

8. The substrate processing apparatus of claim 1, wherein each of the retaining members includes a ring-shaped plate.

9. The substrate processing apparatus of claim 1, wherein the detecting unit is installed in the substrate transfer unit.

10. The substrate processing apparatus of claim 1, wherein the first master data comprises a lower ring reference value, an upper ring reference value, and an allowed ring misalignment range.

11. The substrate processing apparatus of claim 1, wherein the second master data comprises a lower ring reference value, an upper ring reference value, an allowed ring misalignment range, a lower wafer reference value, an upper wafer reference value and an allowed wafer misalignment range.

12. The substrate processing apparatus of claim 1, wherein the states of the substrates comprise presence of the substrates and presence of cracks in the substrates.

13. A method of manufacturing a semiconductor device performed in a substrate processing apparatus including: a substrate retaining mechanism comprising a predetermined number of retaining members for placing substrates thereon and a predetermined number of slots into which the predetermined number of retaining members are inserted; a substrate transfer unit configured to transfer the substrates; a detecting unit configured to detect states of the retaining members and states of the substrates placed on the retaining members; a determination unit configured to compare a waveform data obtained by the detecting unit with a master data to determine the states of the retaining members and the substrates placed on the retaining members, the waveform data representing the states of the retaining members and the states of the substrates placed on the retaining members, and the master data representing normal states of the retaining members and normal states of the substrates placed on the retaining members; and a transfer control unit configured to control the substrate transfer unit, the method comprising:
  (a) determining the states of the retaining members by comparing the waveform data with a first master data including a reference data for location of the retaining members;
  (b) transferring the substrates into the substrate retaining members when the retaining members are determined to be in the normal state according to a result of comparison obtained in (a);
  (c) determining the states of the substrates placed on the retaining members by comparing the waveform data with a second master data including a reference data for location of the substrates placed on the substrate retaining members; and
  (d) loading the substrate retaining mechanism into a process chamber included in the substrate processing apparatus and processing the substrates when the substrates placed on the retaining members are determined to be in the normal state according a result of comparison obtained in (c).

14. A non-transitory recording medium storing a retaining member state detection program executed by a substrate processing apparatus including: a substrate retaining mechanism comprising a predetermined number of retaining members for placing substrates thereon and a predetermined number of slots into which the predetermined number of retaining members are inserted; a substrate transfer unit configured to transfer the substrates; a detecting unit configured to detect states of the retaining members and states of the substrates placed on the retaining members; a determination unit configured to compare a waveform data obtained by the detecting unit with a master data to determine the states of the retaining members and the substrates placed on the retaining members, the waveform data representing the states of the retaining members and the states of the substrates placed on the retaining members, and the master data representing normal states of the retaining members and normal states of the substrates placed on the retaining members; and a transfer control unit configured to control the substrate transfer unit, wherein the retaining member state detection program is operable to:

(a) determine the states of the retaining members by comparing the waveform data with a first master data including a reference data for location of the retaining members;

(b) transfer the substrates into the substrate retaining members when the retaining members are determined to be in the normal state according a result of comparison obtained in sequence (a);

(c) determine the states of the substrates placed on the retaining members by comparing the waveform data with a second master data including a reference data for location of the substrates placed on the substrate retaining members; and (d) load the substrate retaining mechanism into a process chamber included in the substrate processing apparatus and processing the substrates when the substrates placed on the retaining members are determined to be in the normal state according a result of comparison obtained in sequence (c).

* * * * *